United States Patent [15] 3,667,028
Leufgen [45] May 30, 1972

[54] RECTIFIER CIRCUIT INCLUDING TRANSISTORS

[72] Inventor: Axel Leufgen, Muehlheim am Main, Germany
[73] Assignee: Dienes-Honeywell Holding GmbH, Muehlheim am Main, Germany

[22] Filed: Oct. 26, 1970
[21] Appl. No.: 83,917

[30] Foreign Application Priority Data
Nov. 18, 1969 Germany ....................P 19 57 786.7

[52] U.S. Cl. ....................321/47
[51] Int. Cl. ....................H02m 7/12
[58] Field of Search ....................321/47; 324/119

[56] References Cited

UNITED STATES PATENTS

| | | | |
|---|---|---|---|
| 3,083,328 | 3/1963 | Mallery et al. | 321/47 X |
| 2,953,738 | 9/1960 | Bright | 321/47 |
| 3,012,182 | 12/1961 | Ford | 321/47 |
| 3,419,787 | 12/1968 | Baehre | 321/47 X |
| 3,434,034 | 3/1969 | Garber et al. | 321/47 X |

OTHER PUBLICATIONS

IBM Technical Disclosure Bulletin, " Rectifier Using Low Saturation Voltage Transistors," Vol. 13, No. 5, Oct. 1970.
IBM Technical Disclosure Bulletin, " Transistor Half Wave Rectifier," Vol. 1, No. 2, Aug. 1958.
RCA Technical Notes, RCA TN No. 627, August, 1965, " High Efficiency Low Voltage Rectifier."

*Primary Examiner*—William M. Shoop, Jr.
*Attorney*—Lamont B. Koontz and Alan M. Staubly

[57] ABSTRACT

A rectifier circuit which uses transistors, is unaffected by changes in ambient temperature and frequency, and shows a linear relation between input AC and output DC. In the invention, the diode or diodes of a rectifier circuit are replaced by the emitter-collector path of a transistor (Q) and the base electrode of the transistor is connected to one of the output terminals 3 by means of a resistor R1 having a high resistance compared to the base input resistance of the transistor.

5 Claims, 5 Drawing Figures

Patented May 30, 1972 3,667,028

2 Sheets-Sheet 1

INVENTOR.
AXEL LEUFGEN

BY
Alan M. Staubly

ATTORNEY.

INVENTOR.
AXEL LEUFGEN
BY
Alan M. Staubly
ATTORNEY.

RECTIFIER CIRCUIT INCLUDING TRANSISTORS

The invention deals with a transistorized rectifier circuit with linear input/output characteristic for obtaining an output DC-voltage which is independent from changes in ambient temperature and frequency.

For many purposes it is necessary to transduce an input AC-voltage into an output DC-voltage which is linearily dependent on the amplitude of the AC-voltage and does not change with variations of the ambient temperature of the rectifier circuit. Well-known rectifier circuits using transistors, for instance, in an emitter base configuration suffer from the temperature dependency of the base input resistance $R_{BE}$, the current gain $\beta$ and the collector residual current $I_{CEO}$. A further difficulty stems from the fact that, because of the sine-shaped control input at the base electrode of the transistors, the internal resistance between the emitter and the collector of the transistor changes in a distorted sine-shape. This leads to a non-linear behavior of the rectifier circuit and essential filter and smoothing means at the output of the rectifier circuit required.

It is an object of the invention to provide a rectifier circuit which is especially suitable for measuring and control purposes, in which the dependency between the output DC-voltage and the input AC-voltage will not be influenced by temperature changes and in which the internal resistance of a transistor between the collector and the emitter electrode does not change.

This problem is solved according to the invention in that in a rectifier circuit the diode(s) is (are) replaced by the emitter-collector-path of a transistor, and the base electrode of said transistor is connected by means of a resistor to the one of the output terminals, said resistor having a high resistance compared with the base-input resistance of the transistor. The invention not only discloses a very simple measuring circuit but also achieves the possibility of compensating by appropriate selection of the resistance the temperature dependent changes of the transistor characteristics. The rectifier circuit, according to the invention, uses a base configuration of the transistor circuit.

A further improvement of the invention provides connection of a capacitor across the output terminals. This charging capacitor on the one side in known manner filters the output voltage and, on the other side, improves, because of its storage effect, the efficiency of the rectifier circuit.

According to a preferred embodiment of the invention, a voltage source is inserted between the one output terminal and the resistor, said voltage source having the same polarity as the current flow from the emitter to the base electrode of the transistor. This voltage source cares for the supply of current to the base electrode of the transistor even if the AC-voltage across the input terminal approaches zero, so that the emitter-collector-path of the transistor remains conducting until the AC-voltage reaches zero. With this improvement, a charging capacitor can be omitted which makes the rectifier circuit essentially independent from the frequency of the input voltage.

Further modifications of the invention are characterized in the independent claims. The invention will now be described in connection with the accompanying drawings showing several embodiments of the invention. In the drawings:

Figure 1:
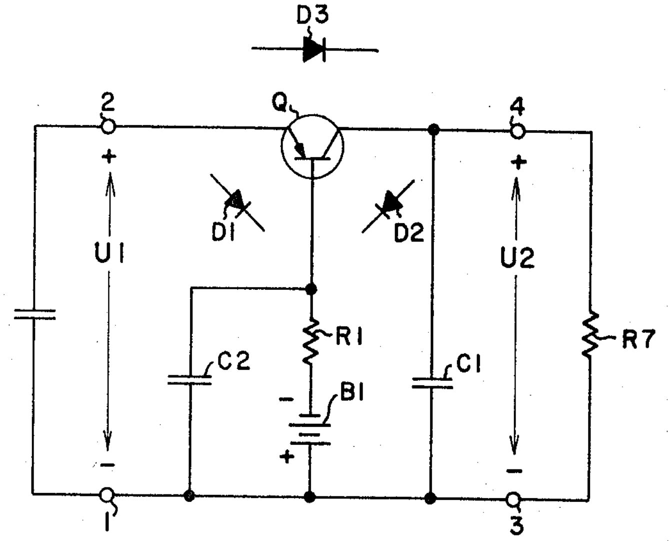
FIG. 1 illustrates the operation of the rectifier circuit

In the circuit diagram, according to FIG. 1, the emitter electrode of the transistor Q is connected to the input terminal 2, and the base electrode of this transistor is connected via a resistor R1 and a battery B1 to the other input terminal 1 of the rectifier circuit. A capacitor C2 is shunted across the series circuit of resistor R1 and battery B1. Output terminal 3 is common with input terminal 1, and output terminal 4 is connected to the collector of transistor Q. Connected across the two output terminals 3 and 4 are a capacitor C1 and a load resistor R7. For explaining the function of the circuit according to FIG. 1, it is assumed that a DC-voltage U1 is applied to input terminals 1 and 2, with terminal 2 being positive and terminal 1 being negative. Furthermore, it should be assumed that battery B1 is short-circuited and capacitors C1 and C2 omitted. In the then present circuit, the transistor works in a base configuration, with the base electrode of transistor Q1 being connected to terminals 1 and 3 via a resistor R1 of high resistance value. Transistor Q1 operates in the saturation range of its characteristic.

For facilitating the operation of the circuit, diode symbols D1 – D3 are associated with transistor Q, with D1 being the base emitter diode, D2 being the base collector diode and D3 being the collector-emitter-path diode. The base resistance R1 is selected with respect to the input voltage U1, the load resistor R7 and the current gain $\beta$ such that transistor Q is saturated, and little changes of the base current can only create very small changes of the collector current. Compared with a rectifying circuit having a diode connected in series with a resistor to the signal source, the simplified circuit, according to FIG. 1, has the following advantages:

The residual voltage between the emitter and the collector of a saturated transistor is about only one-tenth (<0.1 V) of the voltage drop (about 1 V) at a diode in flow direction. Since the transistor operates in saturated condition, differences between the characteristics of the used transistors are rarely to acknowledge. Furthermore, the temperature dependency of the residual voltage determining the saturation range of the transistor is about 20 times smaller than the temperature dependency of the forward voltage drop of a diode.

The simplified circuit,according to FIG. 1, as well as those according to the further embodiments, has not only a very favorable temperature behavior but can be completely temperature-compensated. As already mentioned, the circuit is a saturated base configuration of the transistor so that the base emitter diode D1, as well as the base collector diode D2, are conducting, and the current flowing through resistor R1 comes from both diodes. Current flowing through D2 cannot become zero, since D2 in any case must have a lower voltage drop than D1, and since the collector emitter voltage $U_{C1}$ cannot become zero or even lower than zero. Because of its structure, the base collector diode has a greater temperature dependency than D1. If now transistor Q is heated, the internal resistance of the two diodes D1 and D2 decreases and the current gain $\beta$ is increased. The internal resistance of D2, however, decreases faster than that of D1 so that, with a correct dimensioning of the base resistance R1, the current through D1 remains not only constant but even decreases and therewith compensates the increase of current gain $\beta$. Therewith, the collector emitter voltage $U_{CE}$ remains constant.

If the resistance of resistor R1 is selected too high, the current through D2 increases not enough, and the influence of D2 is too small, and the circuit is not quite compensated (subcompensated), and the output voltage U2 has a positive temperature drift. If, on the other hand R1 is chosen too low, the current through D2 increases strongly, and the influence of D2 becomes too much,and the circuit is overcompensated, showing a negative temperature drift.

If the voltage U1 at the input terminals 1 and 2 is decreased more and more, the emitter base voltage finally falls below the value of the forward voltage of D1 (about 0.7V) so that no current can flow from the emitter to the base, and because of the lacking base current, the emitter-collector-path of the transistor Q is rendered non-conducting. Capacitor C1 is charged to the voltage across output terminals 3 and 4. If now the original assumed input DC-voltage is replaced by an AC-voltage, surprisingly a higher output voltage appears when capacitor C1 is present than if no capacitor C1 is connected across the load. The reason for this is that the capacitor, besides its tendency to be charged to the top value of the AC-voltage, decreases the value of the load resistance. Herewith the voltage difference between the collector and base electrode is decreased because of the increased collector current. As a result of this, a smaller current flows from the collector to the base electrode, with that current not only improving the efficiency of the circuit but also decreasing the voltage drop across resistor R1 and therewith increasing the voltage at the base electrode compared to the voltage at the emitter. Therefore, if a charging capacitor C1 is used, transistor Q is rendered non-conducting only with lower input voltages. A further advantage of capacitor C1 is its filter action on the output voltage. The discharge of capacitor C1 during the second halfwave of the AC-voltage, in which the input terminal 1 is positive with respect to input terminal 2, can be neglected since resistor R7 as well as resistor R1 are of relatively high resistance value.

Even the use of charging capacitor C1 cannot prevent that transistor Q, during the halfwave in which terminal 2 is positive with respect to terminal 1, is rendered non-conducting as soon as the base emitter voltage falls below 0.7 V. For achieving a linear relation between the input AC-voltage and the output DC-voltage also at low AC-voltages, according to the invention, a DC-voltage source is inserted into the emitter base circuit which keeps transistor Q conducting also when the AC-voltage approaches zero. A DC-source operating in this sense is shown in FIG. 1 in form of battery B1. The selection of this battery is essential. On the one side its DC-voltage must be high enough for keeping the emitter base path conducting when the input AC-voltage falls to zero so that via this diode a base current flows in forward direction. On the other side, the voltage of battery B1 is limited to higher values since resistor R1 cannot be made too high. If such a battery B1 is used, the dependency between the input voltage and the output voltage with decreasing input voltages remains linear until a collector residual voltage of about 0.1 V is reached.

If, with the rectifier circuit according to the invention, AC-voltages of different frequencies are to be rectified, the frequency response of the circuit can be improved by disconnecting capacitor C1. Furthermore, the internal capacity of transistor Q can be compensated by a capacitor C2 connected in parallel to resistor R1 and battery B1. With such a configuration, the temperature dependency of the circuit is about $10^{-4}$/ C. and the frequency linearity extends far into the megacycle range.

Figure 2:
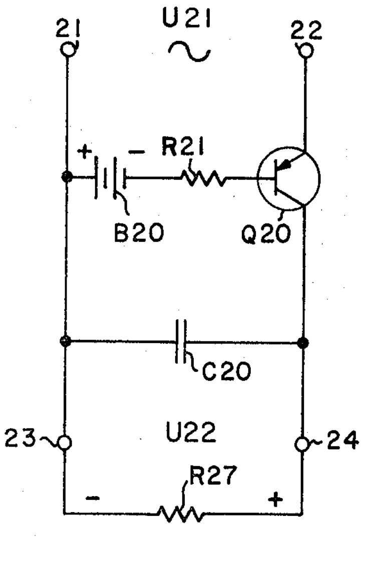
FIG. 2 shows a halfwave rectifier.

The second embodiment shown in FIG. 2 corresponds to that of FIG. 1, with the exception that input terminals 21 and 22 are shown to be connected to an AC-source U21, for instance, a transformer secondary or an AC-generator. Independently from the internal resistance of the AC-source at input terminals 21 and 22, transistor Q20 is fully controlled since resistor R21, which is connected together with a battery B20 between the base electrode of transistor Q20 and the common terminal 21/22, has a high resistance compared with the internal resistance of the voltage source. The emitter of transistor Q20 is connected to input terminal 22 and the collector is connected via output terminal 24 to load resistor R27. A capacitor is connected in parallel to resistor R27. As already explained in connection with the first embodiment, capacitor C20 is charged during the first halfwave of the input AC-voltage during which terminal 22 is positive with respect to terminal 21. During the second halfwave of opposite polarity, transistor Q20 is non-conducting.

Figure 3:
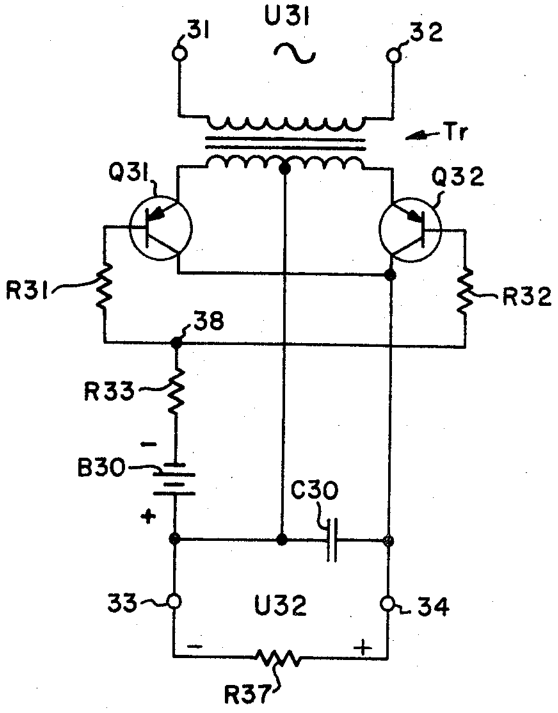
FIG. 3 shows a fullwave rectifier.

The operation of the circuit shown in FIG. 3 is essentially the same as that of the circuit of FIG. 2, with the distinction that FIG. 3 shows a fullwave rectifier so that capacitor C30 is charged by both halfwave of the AC-voltage. Input terminals 31 and 32 are connected to the primary winding of the transformer Tr, the secondary winding of which has a center tap which is connected to output terminal 33. The end terminals of secondary winding are connected to the emitter electrodes of two transistors Q31 and Q32, the collector electrodes of which are connected together, and to output terminal 34. Charging capacitor C30 and load resistor R37 are connected to output terminals 33 and 34. The base electrodes of the two transistors Q31 and Q32 are connected by means of resistors R31 and R32 to a junction point 38 from which a resistor R33 in series with the battery 30 is connected to terminal 33 and the center tap of the secondary winding. Resistor R33 serves for adjusting the working point and the temperature compensation of the circuit. The function of resistor R33 can also be fulfilled by resistors R31 and R32, and then resistor R33 could be omitted. The function of battery B30 and capacitor C30 were already explained above in connection with the halfwave rectifier circuit of FIG. 1.

Figure 4:
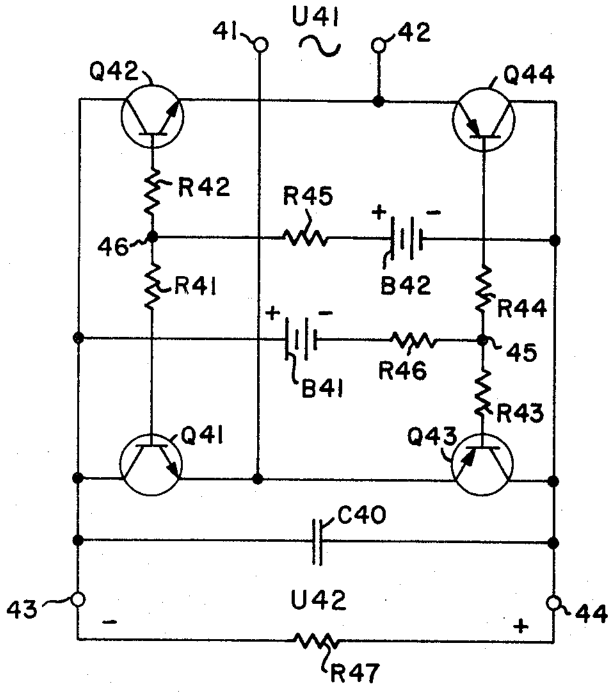
FIG. 4 shows a bridge rectifier.

FIG. 4 shows the invention applied to a rectifier bridge circuit. An AC-voltage source U41 is connected to input terminals 41 and 42, with terminal 41 connected to the emitter electrodes of transistors Q41 and Q43, and terminal 42 being connected to emitter electrodes of transistors Q42 and Q44. The collector electrodes of transistors Q42 and Q41 are connected to output terminal 43, and the collector electrodes of transistors Q44 and Q43 are connected to output terminal 44. A capacitor C40 and a load resistor R47 are connected parallel to output terminals 43 and 44. Output terminal 43, furthermore, is connected via a battery B41 and a resistor R46 to point 45 between resistors R43 and R44, which are connected in series between the base electrodes of transistors Q43 and Q44. Similarly, output terminal 44 is connected via a battery B42 and a resistor R45 to junction point 46 between resistors R41 and R42 connected between the base electrodes of transistors Q41 and Q42. The function of capacitor C40 and of batteries B41 and B42 is the same as previously described in connection with the aforementioned embodiments.

Figure 5:
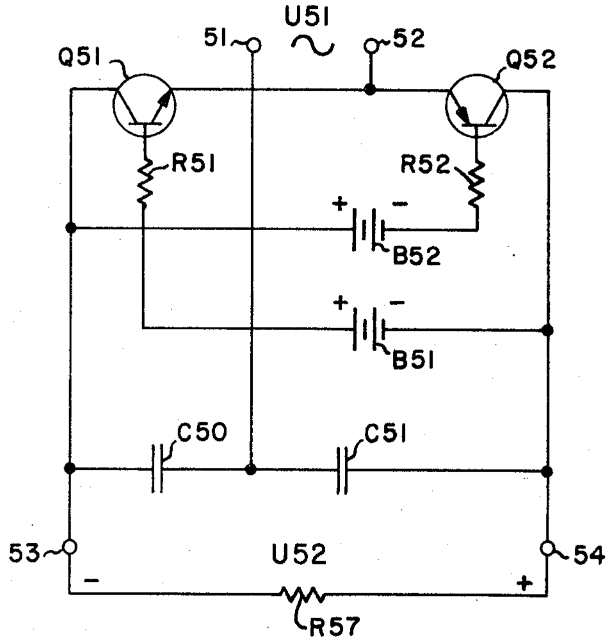
FIG. 5 shows a voltage duplicating rectifier circuit.

FIG. 5 shows a voltage duplicating circuit using the invention. AC-source U51 is connected to input terminals 51 and 52, with terminal 52 being connected to the common emitter electrodes of two transistors Q51 and Q52. Two capacitors C50 and C51 are connected in series between the collector electrodes of the two transistors Q51 and Q52, which are simultaneously connected to output terminals 53 and 54. The junction between the two capacitors C50 and C51 is connected to input terminal 51. Base electrode of transistor Q52 is by means of a resistor R52 and a battery B52 connected to output terminal 53, while base electrode of transistor Q51 is connected via a resistor R51 and a battery B51 to the other output terminal 54.

During the negative halfwave, transistor Q51 charges capacitor C50, and during the positive halfwave, transistor Q52 charges capacitor C51. The voltages across capacitors C50 and C51 appear added at load resistor R57. The function of resistors R51 and R52 and of batteries B51 and B52 correspond to the function of corresponding elements in FIGS. 1 to 4. This circuit of FIG. 5 is especially favorable, since it performs without a transformer at its input a high efficiency. However, it is not frequency-compensated because of capacitors C50 and C51. Voltage changes of batteries B51 and B52, as well as of batteries B1, B20, B30, B41, B42 in the aforementioned embodiments have only a negligible influence on the output voltage. A change of the battery voltage by 0.1 V results in a change of the output voltage of about 1mV.

It is obvious that the embodiments shown can be modified without leaving the principle of the invention. For instance, the transistors can be replaced by transistors of opposite polarity if the polarity of the batteries is changed accordingly. The circuits shown in FIGS. 2, 3 and 4 may be used with capacitors C20, C30 and C40 omitted for improving the insensibility to frequency changes. The frequency characteristic of the circuit could also be improved by connecting capacitors in parallel to the components in the base electrode circuit. In FIG. 5, the circuit could be changed as follows:

Negative terminal of battery B51 and the positive terminal of battery B52 are separated from the corresponding collector electrodes, are connected together and via a resistor connected to terminal 51. Or the base electrodes of transistors Q51 and Q52 are connected via resistors R51 and R52 to the positive terminal and the negative terminal,respectively, of a common battery. A voltage divider comprised of two resistors is connected in parallel to the battery with the central point of the divider being connected directly or via a further resistor to the input terminal 51. Herewith one battery can be omitted.

According to a further embodiment of the invention, the circuit shown in FIGS. 2 to 5 can be connected to the output of a high gain amplifier. The feedback voltage for the amplifier input is derived in connection with a halfwave rectifier, according to FIG. 2, from the DC-output and in connection with circuits, according to FIGS. 3 to 5, from the amplifier output via a similar circuit which, however, is conducting for AC. Such arrangements achieve a completely linear relation between the input AC-voltage and the output DC-voltage, since the feedback circuit shows the same non-linearity in the range below 0.1 V as the rectifier circuit. Therewith the non-linearity of the feedback circuit compensates for the non-linearity of the rectifier circuit. Since, furthermore, both arrangements, rectifier and feedback, have the same temperature behavior, an almost identical temperature compensation is achieved. If the amplifier is a DC-amplifier, DC- and AC-voltages and currents can be measured and amplified without having to determine the polarity previously. If the polarity of DC-voltages should be determined with a circuit, according to FIGS. 3 to 5, one portion or branch of the rectifier should be disconnected. If the input voltage has the correct polarity, the output value remains constant; otherwise, the output value decreases to zero. Such circuits are especially suitable for universal measuring instruments with low internal power consumption.

I claim:

1. A transistorized rectifier circuit having a linear input/output characteristic for obtaining an output DC-voltage which is independent of changes in ambient temperature and frequency, comprising input terminals, output terminals, a transistor having its emitter-collector-path between one input terminal and one output terminal, the base electrode of said transistor being connected by means of a resistor to the other one of the output terminals, said resistor having a high resistance compared with the base-input resistance of the transistor and a voltage source electricslly connected between said other output terminal and the resistor, said voltage source having the same polarity as a current flow from the emitter to the base electrode of the transistor.

2. A rectifier circuit according to claim 1 with a capacitor connected across the resistor and voltage source.

3. A rectifier circuit according to claim 1 connected to the output of an amplifier, the feedback circuit of which includes a similar rectifier circuit which is conducting for AC.

4. A rectifier circuit according to claim 3 wherein the amplifier is a DC-amplifier.

5. A rectifier circuit according to claim 4 for measuring direct current or DC-voltages in combination with switch means for switching off one portion of the rectifier circuit so that the polarity of the input signal can be determined.

* * * * *